(12) United States Patent
Wen et al.

(10) Patent No.: US 6,207,903 B1
(45) Date of Patent: Mar. 27, 2001

(54) VIA TRANSITIONS FOR USE AS MICROMACHINED CIRCUIT INTERCONNECTS

(75) Inventors: Cheng P. Wen, Mission Viejo, CA (US); Linda P. B. Katehi, Northville, MI (US); Stephen Robertson, Springfield, NJ (US); Thomas Ellis, Ann Arbor, MI (US); Katherine Herrick, Ann Arbor, MI (US); Gabriel M. Rebeiz, Ann Arbor, MI (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/209,659

(22) Filed: Dec. 10, 1998

(51) Int. Cl.[7] ........................................... H05K 1/00
(52) U.S. Cl. .............................. 174/253; 174/264; 216/39
(58) Field of Search .................... 174/260, 261, 174/262, 263, 264, 265, 266, 255, 253; 361/748; 257/621, 774, 797; 216/34

(56) References Cited

U.S. PATENT DOCUMENTS

| | | | |
|---|---|---|---|
| 5,056,216 | * | 10/1991 | Madou et al. ........................... 29/843 |
| 5,614,742 | * | 3/1997 | Gessner et al. ....................... 257/254 |
| 5,765,279 | * | 6/1998 | Moresco et al. ....................... 29/840 |
| 5,841,075 | * | 11/1998 | Hanson ................................. 174/250 |
| 5,962,921 | * | 10/1999 | Farnworth et al. ................... 257/773 |
| 6,013,948 | * | 1/2000 | Akram et al. ......................... 257/698 |

* cited by examiner

Primary Examiner—Hyung-Sub Sough
Assistant Examiner—Jeremy Norris
(74) Attorney, Agent, or Firm—Leonard A. Alkov; Glenn H. Lenzen, Jr.

(57) ABSTRACT

Structures and methods that provide for via transitions between opposite sides of a high resistivity silicon micromachined membrane substrate. The via transitions provide ground-signal-ground interconnection between coplanar waveguides disposed on opposite sides of substrate. Adjacent via transitions are anisotropically etched from opposite surfaces of the substrate to form the via transitions. The ground-signal-ground configuration provides RF impedance matching at the via transition.

4 Claims, 3 Drawing Sheets

VIA TRANSITIONS FOR USE AS MICROMACHINED CIRCUIT INTERCONNECTS

BACKGROUND

The present invention relates generally to via interconnects or transitions, and more particularly, to via transitions for use as micromachined circuit interconnects and methods for making such via transitions.

Pyramid-shaped vias have heretofore been used to provide for vertical interconnection between coplanar waveguides on opposite surfaces of a micromachined substrate. Such conventional pyramid-shaped vias are etched from the same surface of a substrate. The span of the ground planes of the coplanar waveguide is dictated by the thickness of the substrate and its anisotropic etching property. The ground plane span frequently approaches one-half wavelength at millimeter-wave frequencies, causing excessive RF signal loss due to radiation. The vertical transition or interconnection is generally inductive in nature, aggravating impedance mismatch at elevated frequencies.

Accordingly, it is an objective of the present invention to provide for improved via interconnects or transitions that may be used as micromachined circuit interconnects or transitions and methods for making such via transitions.

SUMMARY OF THE INVENTION

To accomplish the above and other objectives, in accordance with the principles of the present invention, adjacent via transitions that provide ground-signal-ground interconnection between coplanar waveguides on opposite sides of a high resistivity silicon micro-machined substrate are etched from the opposite surface of the substrate. The resulting metalized vias are physically closer to one another, increasing the capacitance between the signal carrying center via and the two ground vias. This improved ground-signal-ground configuration provides improved RF impedance matching at the via transition. In addition, a smaller distance between the outer edge of the coplanar waveguide ground planes is required to accommodate the new ground-signal-ground vertical interconnect. Reduction of the ground plane span provides for lower radiation loss, and signal attenuation, especially when the total span approaches one-half wavelength (with the dielectric constant of the substrate material taken into account). Furthermore, the use of an integrated stub at the pad area of the three vias drastically confines the field and reduces parasitic radiation.

The present invention minimizes signal attenuation at the vertical interconnect between coplanar waveguides on opposite sides of a micromachined substrate. Etched via hole ground-signal-ground configuration are commonly used. The vias are normally etched from one side of a silicon substrate. The present invention makes use of the anisotropic etching capability of silicon to etch closely spaced, adjacent vies from opposite sides of the substrate, leading to lower signal attenuation at the transition because of reduced radiation loss and improved RF impedance matching.

The present invention is well-adapted for use in airborne millimeter-wave phased array, radars for missile system and weapon systems as well as micromachined technology-based low cost automotive and industrial radar sensors.

The present invention also provides for a method of fabricating a via transition for use as a micromachined circuit interconnect. In the method, a silicon micromachined substrate 1 has a plurality of via holes anisotropically etched through the substrate, wherein alternate via holes are etched from the opposite sides of the substrate. Conductive metallization is then disposed in the vias. In addition, the method may further comprise the steps of forming coplanar waveguides on opposite sides of the substrate, and conductively connecting the coplanar waveguides to the via holes.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

The emerging micromachined technology based microwave and millimeter-wave integrated circuit packaging approach represents a paradigm shift in high volume microwave module manufacturing. Compact, precision circuits with excellent isolation characteristics unattainable using conventional techniques can be batch fabricated on multilayer silicon structures. Finite ground plane coplanar waveguide is one of the preferred transmission systems for such structures.

Figure 1A:
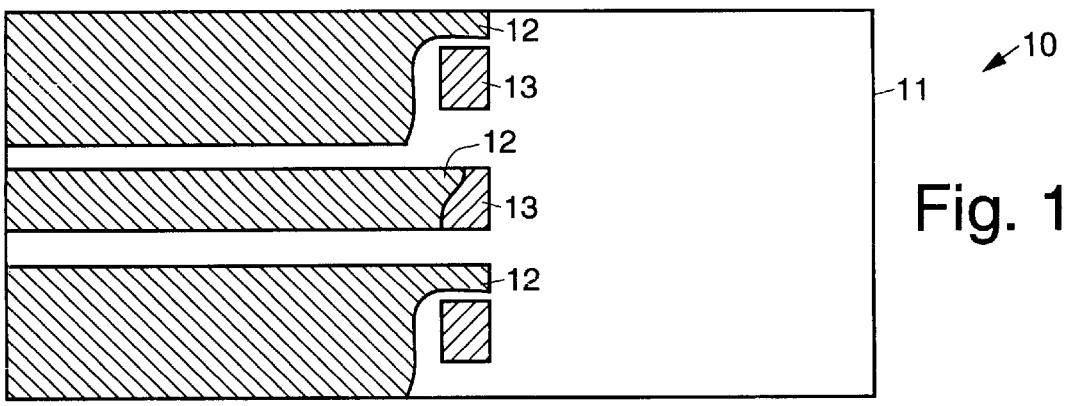
FIGS. 1a and 1b illustrate top and cross-sectional views, respectively, of a signal-ground-signal via interconnect for coplanar waveguides on opposite sides of a micromachined substrate.
Figure 1B:
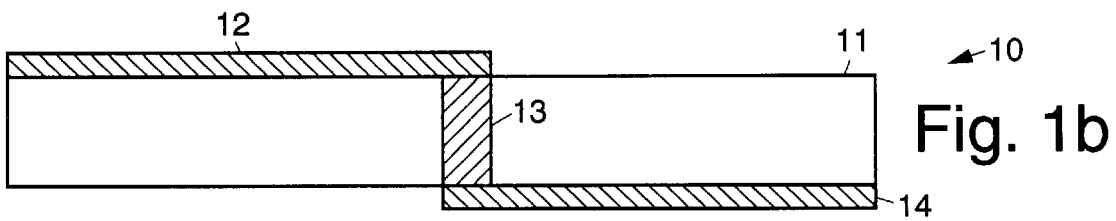

Referring now to the drawing figures, FIGS. 1a and 1b illustrate top and cross-sectional views, respectively, of a representative signal-ground-signal vertical via interconnect 10 for coplanar waveguides disposed on opposite sides of a micromachined substrate 11. Signal, ground and signal conductors 12, 14 are disposed adjacent one another on each side of the micromachined substrate 11. Etched rectangular vias 13 are formed through the micromachined substrate 11 to interconnect the respective signal and ground conductors 12.

Figure 2A:
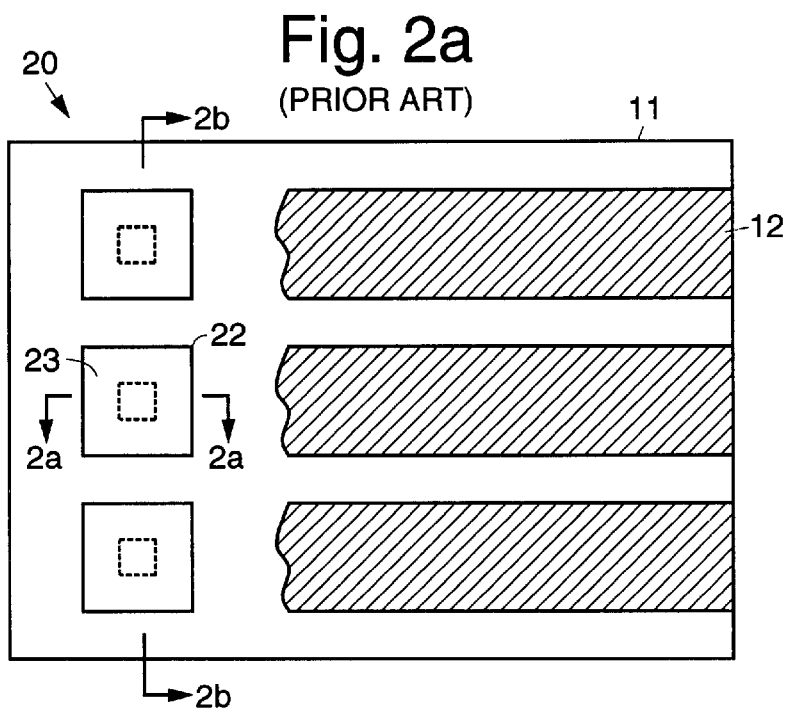
FIGS. 2a–2c illustrate top and two cross-sectional views, respectively, of a conventional vertical via electrical interconnect with ground-signal-ground configuration; all via holes etched from the same surface of a substrate.
Figure 2B:
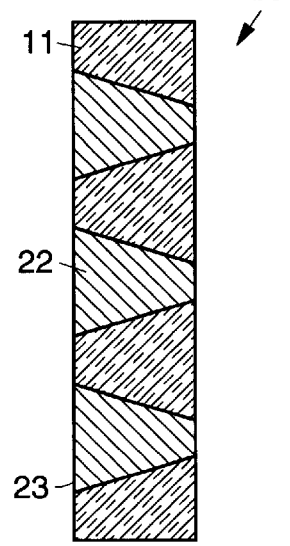
Figure 2C:
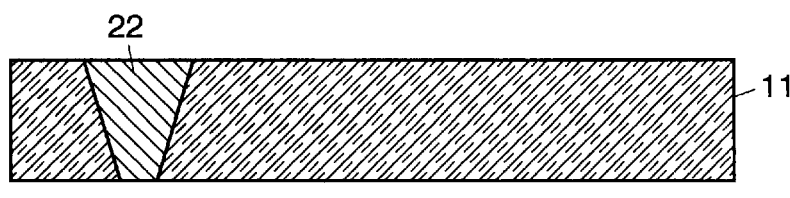
Figure 3A:
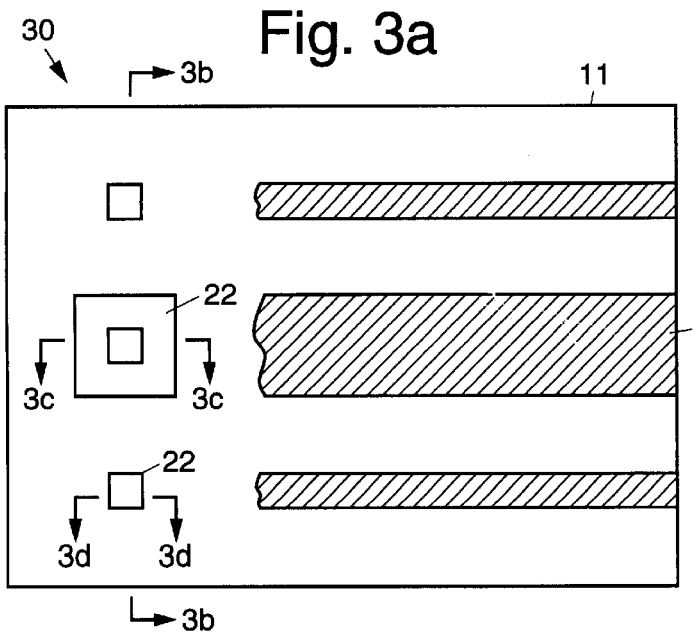
FIGS. 3a–3d illustrate top and three cross-sectional views, respectively, of via connections in accordance with the principles of the present invention.
Figure 3B:
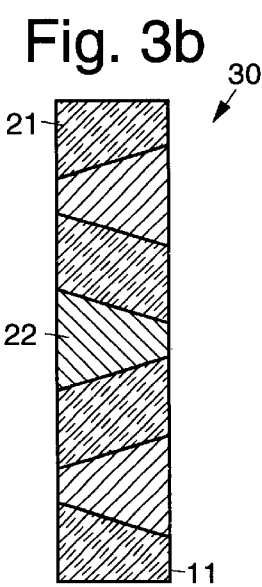
Figure 3C:
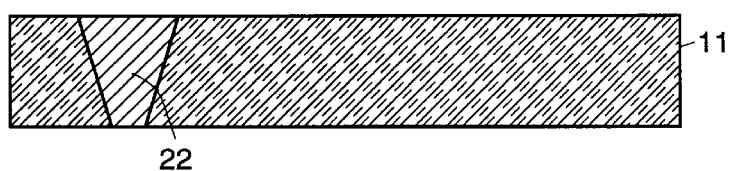
Figure 3D:
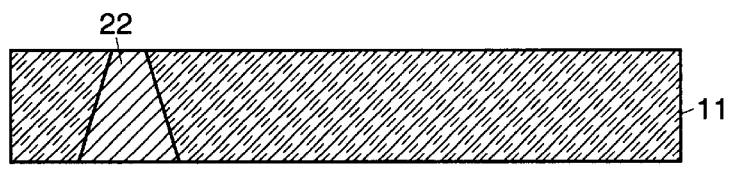

Referring to FIGS. 2a–2c, they illustrate top and two cross-sectional views, respectively, of a conventional vertical via electrical interconnect 20 having a ground-signal-ground configuration for use in micromachined- technology-based microwave assemblies. All via holes 22 are etched from the same surface of a substrate 11. Pyramid shaped ground-signal-ground via holes 22 shown in FIG. 2 result from anisotropic etching of the silicon-based micromachined substrate 11, and are used to connect coplanar waveguides (not shown) disposed on opposite sides of the substrate 11. Metalized inner side walls 23 of the pyramid shaped via holes 22 are crystalline <111> planes.

This conventional approach to interconnection of coplanar waveguides results in a series resistor-inductor lumped equivalent circuit for the three via holes 22, which represents a circuit discontinuity. The impedance mismatch associated with the circuit discontinuity becomes more pronounced at higher frequencies, where the dimensions and the center-to-center distance of the via holes 22 approach a significant fraction of a wavelength. For example, the impedance of the series inductor increases linearly with frequency. At the same time, the three via hole transition can behave like a half-wavelength dipole radiating element if the outer edge of the via holes 22 have a dimension approaching half a wavelength at signal frequencies. RF signal attenuation can be minimized by reducing circuit mismatch and radiation loss.

Referring now to FIGS. 3a–3d, they illustrate top and three cross-sectional views, respectively, of an via connection 30 or transition 30 in accordance with the principles of the present invention that is formed through a silicon micromachined substrate 11. The substrate 11 is selected to be a high-resistivity silicon micromachined substrate 11. In the via transition 30, alternate via holes 22 are etched from opposite sides of the substrate 11 relative to the other via holes 22 to achieve closer spacing therebetween and improved impedance matching. In accordance with the principles of the present invention, the anisotropic etch property of the silicon micromachined substrate 11 is used to advantage. Adjacent via holes 22 for ground-signal-ground interconnects between coplanar waveguides 12, 14 (shown in FIGS. 4a and 4b) disposed on opposite sides of the silicon micromachined substrate 11 are anisotropically etched from opposite surfaces of the substrate 11, as shown in FIGS. 3a–3d. Subsequent to etching, the vias 22 are metallized using a conductive material such as gold, for example. A reduction in total width (outer edge to outer edge) of the ground plane leads to a reduction in radiation loss at the transition.

The resulting metalized via holes 22 are physically closer to one another compared to those shown in FIG. 2, which increases the capacitance between the signal carrying center via hole 22 and the two ground via holes 22. This improved ground-signal-ground configuration leads to improved RF impedance matching at the via transition. In addition, a smaller distance or span between outer edges of the coplanar waveguide ground planes is required to accommodate the new ground-signal-ground vertical interconnect. A reduction in ground plane span results in lower radiation loss, and signal attenuation, especially when the total span approaches one-half wavelength (with the dielectric constant of the substrate material taken into account).

Figure 4A:
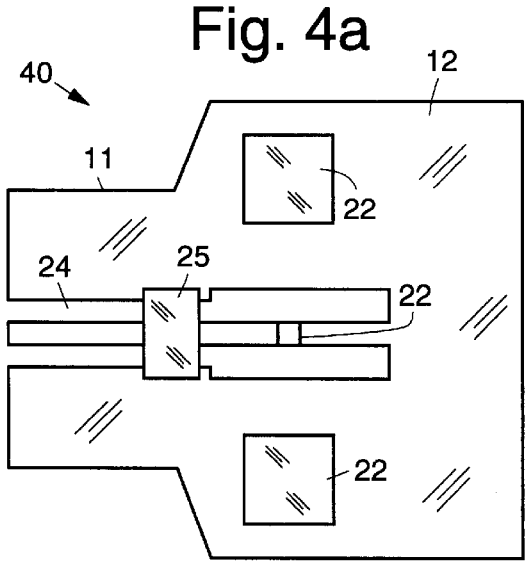
FIGS. 4a and 4b illustrate top and bottom views, respectively, of a W-band 3-wire vertical interconnect.
Figure 4B:
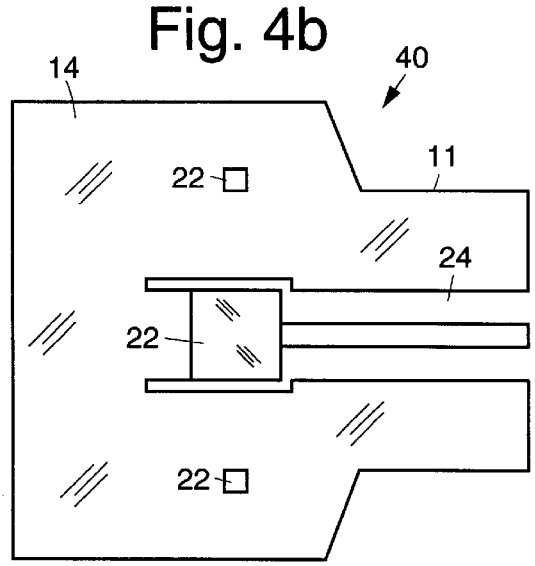
Figure 5:
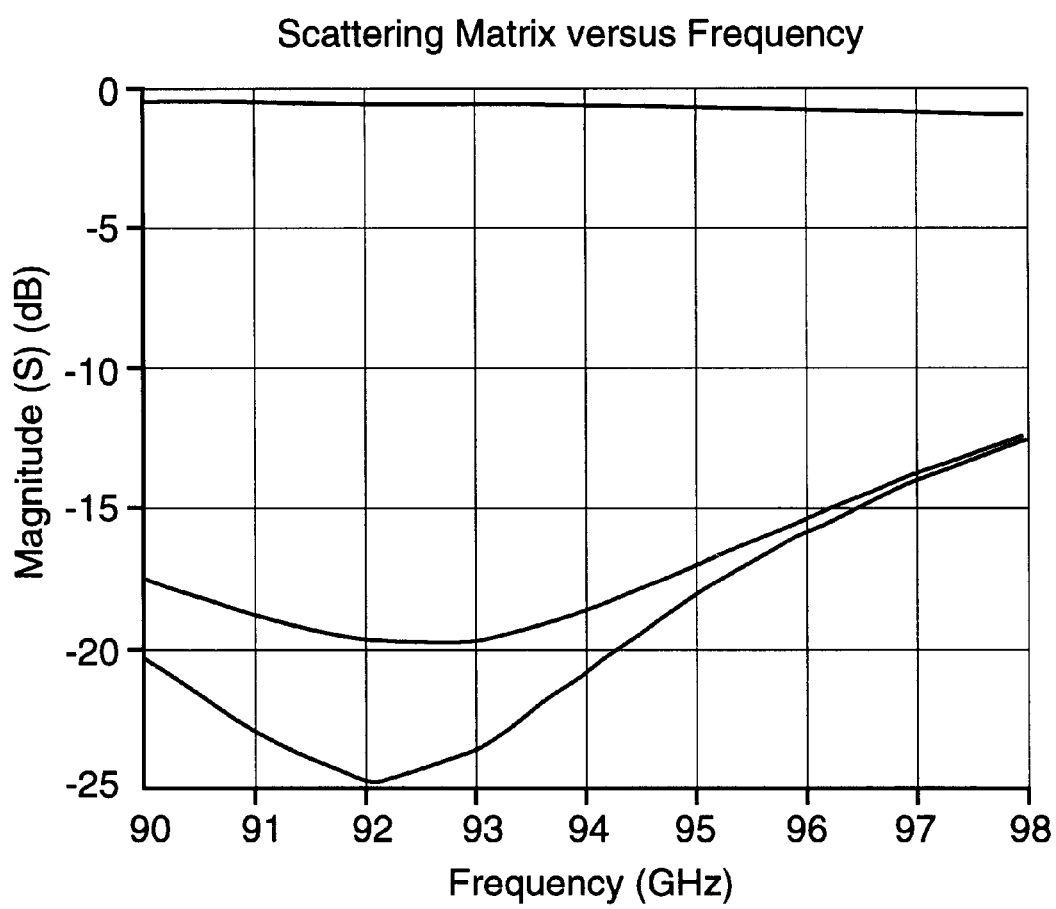
FIG. 5 illustrates a graph of simulated S-parameters of the W-band vertical interconnect of FIG. 4.

FIGS. 4a and 4b illustrate top and bottom views, respectively, of a W-band 3-wire via interconnect 40 made in accordance with the principles of the present invention. A graph of the S-parameters from an electromagnetic simulation of the W-band 3-wire via interconnect 40 of in FIG. 4 is shown in FIG. 5. The upper trace corresponds to the insertion loss of the transition. The middle trace corresponds to $S_{11}$, which is the input mismatch of the reflected signal. The lower trace corresponds to radiation loss at the transition. Insertion loss is approximately 0.4 dB; $S_{11}$ approaches −19 dB and the radiation loss is in the 11–12 dB range.

The improved via transition between coplanar waveguides provided by the present invention is well adapted for use with radar and communication systems that use micromachined, circuit assemblies. For example, the present invention is well-adapted for use in airborne millimeter-wave phased array, radars for missile system and weapon systems as well as micromachined technology-based low cost automotive and industrial radar sensors, for example.

The present invention also provides for a method of fabricating a via transition 30 for use as a micromachined circuit interconnect. The method comprises the steps of providing a silicon micromachined substrate 11 having opposite sides, anisotropically etching a plurality of via holes 22 through the substrate, wherein alternate via holes are etched from the opposite sides of the substrate, and disposing conductive metallization in the vias 22. In addition, the method may further comprise the steps of forming coplanar waveguides 12, 14 on opposite sides of the silicon micromachined substrate 11, and conductively connecting the coplanar waveguides 12, 14 to the via holes 22.

Thus, improved via interconnects or transitions for use as micromachined circuit interconnects and fabrication methods for making same have been disclosed. It is to be understood that the described embodiments are merely illustrative of some of the many specific embodiments that represent applications of the principles of the present invention. Clearly, numerous and other arrangements can be readily devised by those skilled in the art without departing from the scope of the invention.

What is claimed is:

1. A via transition for use as a micromachined circuit interconnect, said transition comprising:

a silicon micromachined substrate having opposite sides;

a plurality of anisotropically etched via holes disposed through the substrate, wherein alternate via holes are etched from the opposite sides of the substrate; and conductive metallization disposed in the vias.

2. The via transition of claim 1 further comprising:

coplanar waveguides disposed on opposite sides of the silicon micromachined substrate that are conductively connected to the via holes.

3. A method of fabricating a via transition for use as a micromachined circuit interconnect, said method comprising the steps of:

providing a silicon micromachined substrate having opposite sides;

anisotropically etching a plurality of via holes through the substrate, wherein alternate via holes are etched from the opposite sides of the substrate; and disposing conductive metallization in the vias.

4. The method of claim 3 further comprising the steps of:

forming coplanar waveguides on opposite sides of the silicon micromachined substrate; and conductively connecting the coplanar waveguides to the via holes.

* * * * *